United States Patent [19]
Bertin et al.

[11] Patent Number: 5,811,868
[45] Date of Patent: Sep. 22, 1998

[54] INTEGRATED HIGH-PERFORMANCE DECOUPLING CAPACITOR

[75] Inventors: Claude Louis Bertin, S. Burlington; Wayne John Howell, Williston; William Robert Patrick Tonti; Jerzy Maria Zalesnski, both of Essex Junction, all of Vt.

[73] Assignee: International Business Machines Corp., Armonk, N.Y.

[21] Appl. No.: 781,966

[22] Filed: Dec. 20, 1996

[51] Int. Cl.$^6$ ............................ H01L 29/78; H01L 27/08
[52] U.S. Cl. .................... 257/516; 257/532; 257/520; 257/502; 257/503; 257/508; 257/307; 257/309; 257/71; 257/758; 361/306.2; 361/271
[58] Field of Search ............................. 257/532, 700, 257/758, 68, 71, 296–313, 374, 502, 503, 508, 510, 513, 514, 516, 520, 535, 659; 361/271, 306.1, 306.2; 437/919, 60

[56] References Cited

U.S. PATENT DOCUMENTS

| | | | |
|---|---|---|---|
| 4,675,717 | 6/1987 | Herrero et al. | 257/777 |
| 4,881,115 | 11/1989 | Lesk et al. | 257/502 |
| 4,900,689 | 2/1990 | Bajor et al. | 257/520 |
| 4,945,399 | 7/1990 | Brown et al. | 257/698 |
| 4,959,705 | 9/1990 | Lemnios et al. | 257/532 |
| 5,034,850 | 7/1991 | Hernandez et al. | 361/306 |
| 5,097,315 | 3/1992 | Shiga | 257/532 |
| 5,162,264 | 11/1992 | Haug et al. | 437/209 |
| 5,208,726 | 5/1993 | Apel | 257/532 |
| 5,212,402 | 5/1993 | Higgins, III | 257/532 |
| 5,351,163 | 9/1994 | Dawson et al. | 361/321.1 |
| 5,407,854 | 4/1995 | Baxter et al. | 437/54 |
| 5,442,223 | 8/1995 | Fujii | 257/508 |
| 5,472,900 | 12/1995 | Vu et al. | 437/60 |
| 5,581,110 | 12/1996 | Razonk et al. | 257/520 |

FOREIGN PATENT DOCUMENTS

| | | |
|---|---|---|
| 54-110790 | 8/1979 | Japan . |
| 57-104265 | 6/1982 | Japan . |
| 58-128754 | 8/1983 | Japan ...................... 257/700 |
| 63-65641 | 3/1988 | Japan ...................... 257/508 |
| 63-155653 | 6/1988 | Japan ...................... 257/508 |

OTHER PUBLICATIONS

Agusta et al. "Monolithic Integrated Semiconductor Structure with Multilevel Conductive Interconnection Planes" I.B.M. Technical Disclosure Bulletin, vol. 9, No. 7 pp. 951–952, Dec. 1966.

"Integrated, Low Inductance, Small Area Capacitors For VLSI Semiconductor Packages", C.H. Bajorek, et al., IBM Tech. Discl. Bull., vol. 25, No. 2, Jul. 1982, pp. 883–888.

"Decoupling Capacitor Placement", J. Parisi, IBM Tech. Discl. Bull., vol. 19, No. 8, Jan. 1977, pp. 3046–3047.

*Primary Examiner*—Tom Thomas
*Assistant Examiner*—Alexander Oscar Williams
*Attorney, Agent, or Firm*—Thornton & Thornton; Robert A. Walsh

[57] ABSTRACT

An integrated high-performance decoupling capacitor, formed on a semiconductor chip, using the substrate of the chip itself in conjunction with a metallic deposit formed on the presently unused chip back surface and electrically connected to the active chip circuit to result in a significant and very effective decoupling capacitor in close proximity to the active circuit on the chip requiring such decoupling capacitance.

Specifically the present invention achieves this desirable result by providing a dielectric layer on the unused backside of the chip and forming a metal deposit on the formed backside dielectric layer and an electrical connection, between the metallic deposit and the active chip circuit via a through hole in the chip.

Very precise decoupling of selected areas in the chip circuit can be achieved by forming precise and multiple metal deposits of either the same size or of varying sizes to define specific capacitances and individually connecting these deposits to the circuit areas needing the precise decoupling capacitance.

19 Claims, 4 Drawing Sheets

INTEGRATED HIGH-PERFORMANCE DECOUPLING CAPACITOR

FIELD OF THE INVENTION

This invention relates generally to semiconductor integrated circuits decoupling capacitors and more particularly to an integrated circuit formed on the active front major surface of a semiconductor chip and having a decoupling capacitor formed on the inactive back major surface of the chip such that the chip substrate functions as one plate of the decoupling capacitor.

BACKGROUND OF THE INVENTION

As integrated circuits on semiconductor chips become denser, faster and more complex, their electrical performance requirements become higher. Consequently these integrated circuits require greater and more effective capacitive decoupling.

Currently, only two effective ways have been used by or known to the industry, to address this need for larger and more effective capacitive decoupling in integrated circuits.

The first way depends on discrete decoupling capacitors being added onto the package containing the integrated semiconductor chip. Because the decoupling capacitors are far removed from the active circuitry on the chip they provide, at best, only marginal decoupling. Furthermore as the circuits and hence the chips become larger the decoupling effects of such off chip capacitors become further degraded.

The second way depends on the adequacy of available regions in the circuity itself. However, as the chip circuitry becomes denser, the free area into which such decoupling capacitors can be placed becomes reduced at the same time that the demand for more decoupling capacitance is increasing. Simultaneously the deposited oxide on the active major circuit front major surface or face is becoming thinner while the need to decouple large on-chip voltages or voltage spikes, requiring thicker oxides or larger area or both becomes greater.

Thus just as the size and number of such decoupling capacitors that can be placed in unused areas on the active front major surface of the semiconductor chip becomes fewer and smaller and more ineffective there is an increasing need for more decoupling capacitance.

SUMMARY OF THE INVENTION

The present invention solves this problem and provides the means of applying significant amounts of effective on-chip decoupling capacitance in an integrated circuit, regardless of the density of the formed circuit.

This is achieved by providing a decoupling capacitance that uses the substrate of the chip itself as one of the capacitive plates while the other plate is comprised of a metallic deposit formed on the back or inactive major surface of the chip and electrically connected to the active circuit on the front or active major surface of the chip.

The present invention thus results in significant and effective decoupling capacitance in close proximity to the active circuit on the chip requiring such decoupling capacitance.

More specifically the present invention achieves this desirable result by providing a metal coated, dielectric layer on the unused backside of the chip that serves as a first plate of the decoupling capacitor and employing the chip substrate as the second plate of the decoupling capacitor.

Very precise decoupling of selected areas in the chip circuit can be achieved by forming a plurality of precisely sized metal deposits on the insulated back surface of the chip and selectively and individually connecting, through appropriate vias, these deposits to the circuits, on the front surface of the chip, needing the precise decoupling capacitance.

Accordingly it is an object of the invention to provide a significant and very effective decoupling capacitor in close proximity to the active circuit on the chip requiring such decoupling capacitance.

These and other objects and features of the present invention will become further apparent from the following description taken in conjunction with the drawings.

DESCRIPTION OF THE PREFERRED EMBODIMENT

Figure 1:
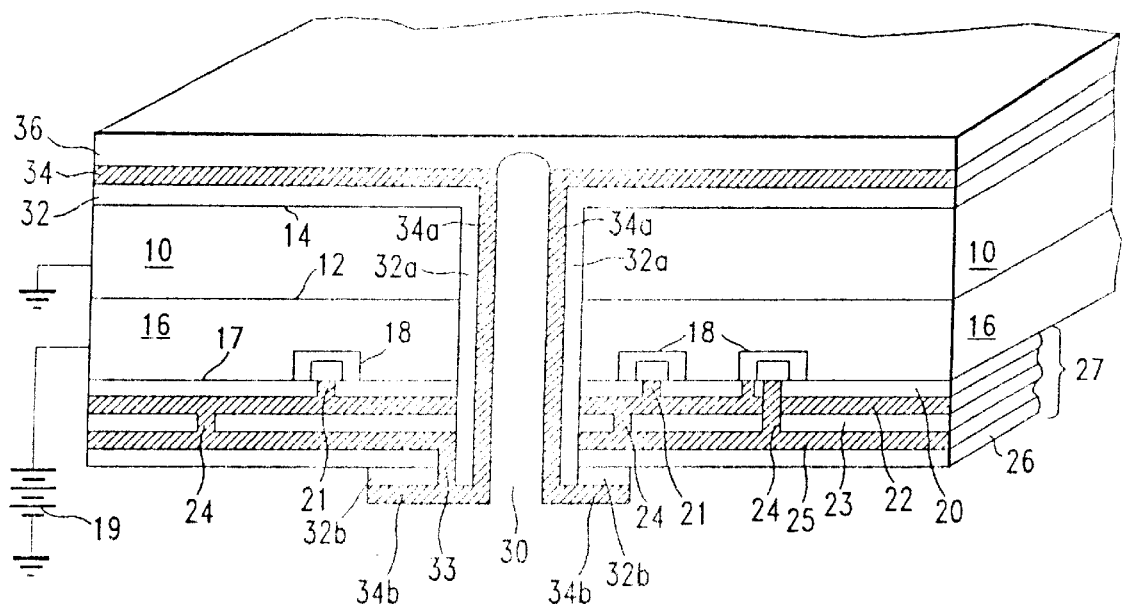
FIG. 1 is a cross-sectional schematic representation of a semiconductor chip having an integrated circuit formed on one face thereof and having a decoupling capacitor, in accordance with the present invention, formed thereon.

FIG. 1 is a cross-sectional schematic representation of an semiconductor chip 10 employing the present invention. The semiconductor chip or substrate 10 has a pair of substantially parallel major surfaces 12 and 14. A doped or epitaxial layer or region 16 is created on surface 12 and a plurality of devices 18 are created in the region 16 by, for example, diffusion or ion implantation or any other suitable method known to the semiconductor art. Thus surface 12 is hereby defined as the active surface or face of the chip and surface 14 as the back or inactive surface of the chip.

The devices 18, are used herein to represent both active and inactive circuit elements, e.g. transistors or resistors. To achieve the proper biasing of the devices 18, one or more wiring levels, interposed with insulating or passivating layers, are formed on the surface 17 of the region 16 to interconnect the formed devices 18 into a desired integrated circuit. In present day integrated circuits, the region 16 and the circuit formed of the devices 18 are coupled to a selected voltage source 19, usually positive, and the substrate 10 is connected to ground. This is possible because of the semiconductor junction existing, at surface 12, between the region 16 and the substrate 10. It should be noted that the substrate 10 could be connected to a second voltage source, such as a negative voltage source, instead of to ground.

More specifically, the desired circuit configuration is created by forming a first insulating layer 20 on the surface 12 and forming interconnection openings 21 therein by etching or the like. A first wiring layer 22 is now formed on the surface of the insulating layer 20 and contacts are made to selected portions of selected ones of the devices 18 through the interconnection openings 21. A second insulating layer of silicon oxide 23 is now formed over the formed wiring layer 22. Following the formation of the insulating layer 23 different interconnection openings 24 are made therein and a second wiring layer 25 is formed on the surface of the insulating layer 23 with the material of the second layer 25 contacting selected portions of the devices 18 as well as selected points on the first wiring layer 22 through the openings 24. A final top passivating layer 26 is disposed over this second wiring level 25. the layers 20,22,23 and 25 together form a wiring net 27.

It should be understood that the above steps of forming the insulating layers, the interconnection openings therein and the wiring levels can be repeated any number of times until the final desired circuit is formed. The formation of such multiple wiring levels is widely practiced in the semiconductor art.

Now, in accordance with the present invention, a precisely positioned via 30, having an inner diameter of approximately 0.003 inches, is ablated through the substrate 10, the epitaxial layer 16, the insulating layers, 20, 23, and 26 and the wiring levels 22 and 25, by applying a laser beam from an XeCl excimer laser to a selected position on the chip 10.

The laser beam, for accomplishing this task, preferably, has a wavelength of 308 nanometers (nm) with a pulse width (FWHM) of 25 nanoseconds (ns). The laser beam is first passed through a commercially available beam homogenizer to develop a uniform intensity profile and then through suitable 10× reducing optics. Beam fluence of 17–30 Joules/cm$^2$ for 20–30 seconds at a pulse rate of approximately 200 pulses per second is particularly suitable for forming the desired via 30.

The laser beam, striking the chip, ablates all the material thereon, as well as the silicon of the chip itself, and forms a precise, cylindrical hole or via 30 therethrough. Using the above described laser the formed via 30 typically has an inner diameter of approximately 0.003 inches and is almost ideally cylindrical in form.

It should be noted that the diameter of the via can be altered by changing the above characteristics of the laser beam as is known to those skilled in the art.

It should also be noted that although only a single laser formed via 30 is shown in FIG. 1 that a plurality of such vias or holes can be formed in the substrate provided that the vias are separated from the edge or from one another by a distance equal to a least four times the inner diameter of the formed via. Other than these constraints there are no inherent limitations on where these vias can be formed in the chip substrate. However it should be clearly understood that the design of the integrated circuit formed on the active surface 12 can further constrain the location of these vias.

That is, the formed via must be positioned with consideration as to the location of the devices 18, the wiring levels produced on the active face of the chip and any interconnections therebetween.

Once the via 30 is formed through the entire body 10, the backside surface 14 is provided with a dielectric coating or layer 32 which extends down the entire length of the via 30 as layer 32a and wraps around the bottom of the via 30, as layer 32b to overlie a small portion of the passivation layer 26 and the wiring net 27. Preferably these dielectric layers 32, 32a and 32b are formed of Silicon Dioxide (SiO$_2$) ranging between 50 and 5000 Angstoms in thickness. Other suitable dielectrics are Polyamide and Silicon Nitride.

These dielectric layers 32, 32a and 32b can be formed using either of the below described low temperature Silicon Dioxide growth techniques.

The first technique consists of the following procedure.

The wafer to be treated is immersed into an aqueous solution of 3650 ml ethanolamine, 1660 ml deionized water, 1150 grams of gallic acid, 0.3 ml of a 10% surfactant solution comprised of potassium fluorinated alkyl carboxalates and sold under the trade name FC-129 by the 3M Corp. and from 0.006 to 0.5M of quinoxaline which produces at higher catalyst concentration a suitable dielectric coating, such as silicon dioxide (SiO$_2$), both on the surface 14 of the wafer as well as on the wall of the laser created via 30. By controlling the thickness of the oxide, forming layers 32, 32a and 32b, the core of the via 30 is left open so that a conductive material 34a can be coated onto dielectric layer 32a coating the wall of the via 30 as will be later described.

The second technique is a low temperature deposition of silicon dioxide by a plasma enhanced chemical vapor deposition process. This process uses any commercially available apparatus having a 13.56 MHz RF power source, an electrode spacing of 3.2 cm. and a top electrode maintained at 80° C. This apparatus is capable of depositing SiO$_2$ on a substrate at a rate of approximately 60 Å per minute when the substrate is held temperature of 350° C., the reactive gases, N$_2$O and SiH$_2$, introduced into the chamber containing the substrate, have a ratio greater than 100, preferably a ratio of approximately 125, with the chamber pressure at 1 Torr and the power level at 25 watts.

Following the formation of the dielectric layers 32, 32a and 32b an interconnection opening 33 is made through the dielectric 32b, and the passivation layer 26 to contact to one of the wiring levels 22 or 25, forming the wiring net 27, and a conductive layer 34, formed of any suitable conductive material, for example, of a metal, such as aluminum, copper, tungsten, gold, lead, tin, silicon, titanium, chrome or combinations thereof, is deposited over the dielectric layer 32, as layer 34, down the length of the via 30 as layer 34a and wrapped around the end of the via 30 as layer 34b to pass through the interconnection opening 33 and connect to the wiring net 27. The formation of these metal layers can be made in any number of ways well known to the semiconductor art among which are plating, evaporation or sputtering techniques.

In this way the metallic layer 34 is connected to a respective voltage in the wiring net 27.

By connecting the layer 34 to the circuit such that the layer 34 is biased positive with respect to the grounded substrate 10, the layer 34 will serve as one plate of the decoupling capacitor and the substrate 10 serves as the other plate of the capacitor.

The layer 34 may be insulatively coated with a suitable dielectric 36 and the circuit completed by forming input/output pads (not shown) connected to the wiring net and then appropriately securing the finished unit to a suitable semiconductor package.

Figure 2:
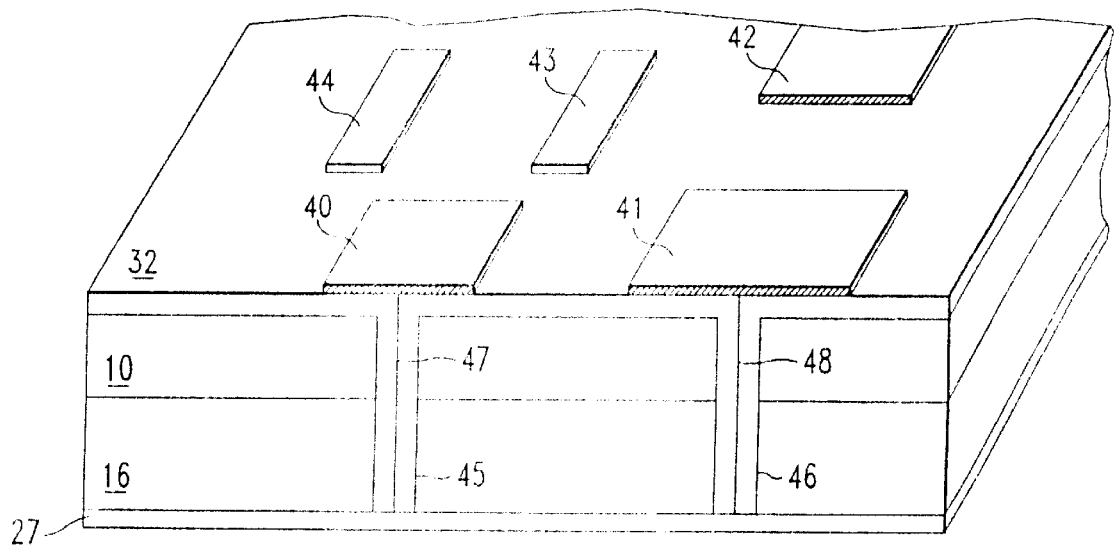
FIG. 2 is a cross-sectional schematic representation of a semiconductor chip having an integrated circuit formed on one face thereof and having a plurality of decoupling capacitors, in accordance with the present invention, formed thereon.

Turning now to FIG. 2 a different embodiment of the invention will be discussed. Shown in this FIG. 2, the layer 34 is divided into a multiplicity of individual plates 40, 41, 42, 43 and 44, each of which is separately coupled to respective points in the wiring network 27 requiring an individual decoupling capacitor. Plates 43 and 44 are shown as being identical in size. Plates 40 and 41 are schematically shown connected to wiring network 27 through respective vias 45 and 46 by respective connectors 47 and 48.

Very precise decoupling of selected areas in the chip circuit can be achieved by forming such a plurality of precisely sized metal deposits on the insulated back surface of the chip and selectively and individually connecting, through appropriate vias, these deposits to the circuits, on the front surface of the chip, needing the precise decoupling capacitance.

Although only two of the capacitors, 43 and 44, are shown as identical in size, it should be understood that all the plates 40, 41, 42, 43 and 44 can be identical in size and capacitive value or all may be different in size and capacitive value.

In this way, the invention provides larger, more precisely designed and very effective decoupling capacitors to specified portions of the circuit.

Figure 3:
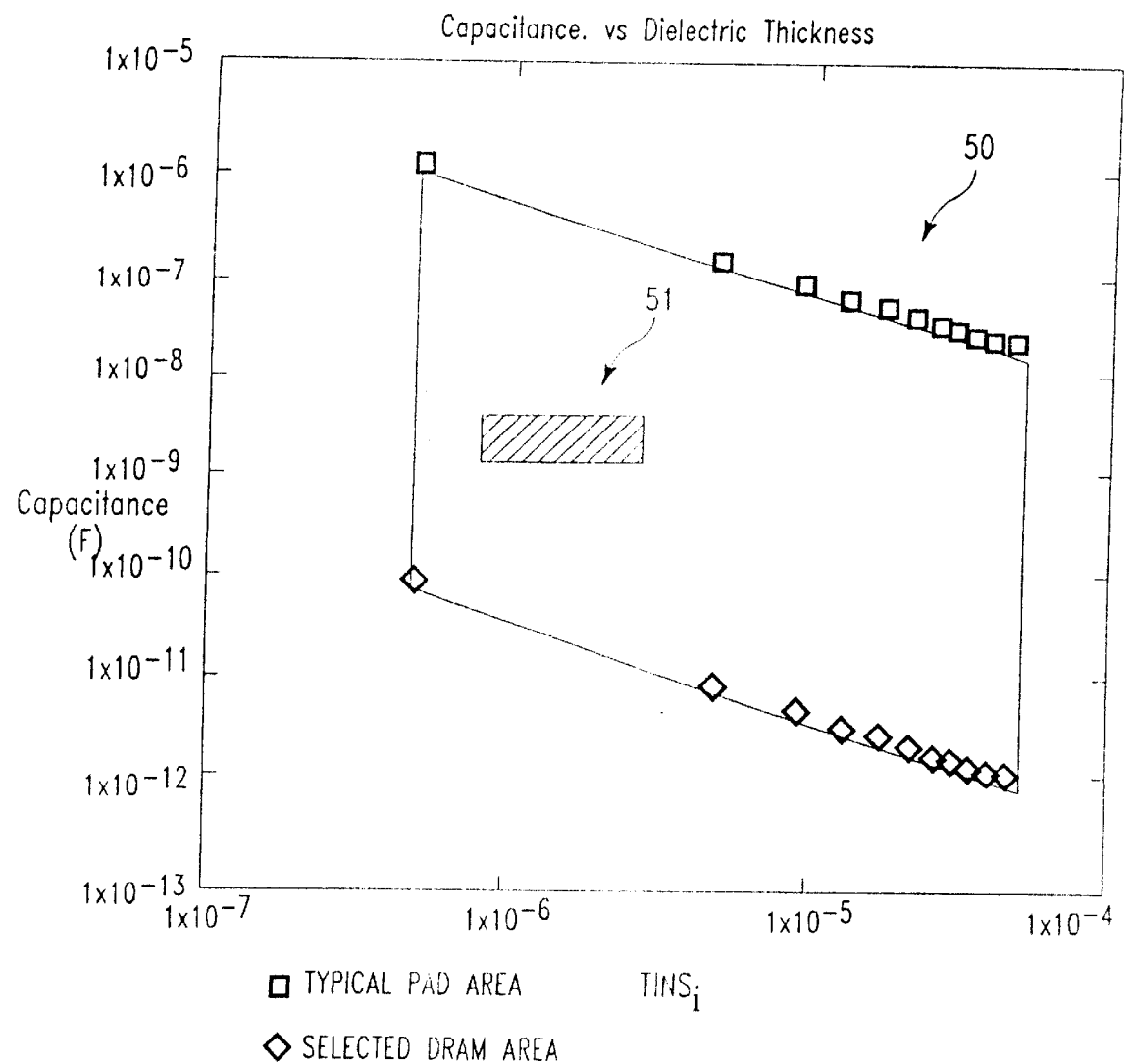
FIG. 3 is a graph depicting the range of the formed capacitance of the present invention as a function of the backside insulation thickness and comparing the scope of the present invention to the scope of the prior art decoupling capacitance.

Turning now to FIG. 3 there is shown a graph depicting the range of the formed capacitance of the present invention as a function of the backside insulation thickness and comparing the capacitor formed in accordance with the present invention to the typical prior art decoupling capacitors.

The graph of FIG. 3 is representative of the capacitance available on a particular sized integrated circuit chip and illustrates the variation in capacitance for that chip versus the available insulator thicknesses.

In the graph of FIG. 3 the parallelogram 50 sets forth a typical design range of decoupling capacitors formed, in accordance with the present invention, on the back side of the integrated circuit described below. The smaller window 51 depicts the typical design range of decoupling capacitors formed, in accordance with the prior art, on the active face of the same integrated circuit.

As is well known the desired capacitor size is established by the well known capacitor equation $$C = \epsilon A / s$$

where $\epsilon$ is the permittivity of the chosen dielectric; A is the area of the electrodes and s the thickness of the formed dielectric layers 32, 32a and 32b.

The decoupling capacitance for a typical prior art chip which depends on available space on the active face of the integrated circuit can be determined as follows. If we assume that a typical chip is 0.8 cm long and has a width of 1.75 cm then one face thereof has an area A of 1.4 cm$^2$. and if we further assume the dielectric is silicon dioxide having a thickness s of $100 \times 10^{-8}$ cm and a permitivity $\epsilon$ of $34.5 \times 10^{-14}$ Fd/cm and the typical pad size, used on the active face of present day integrated circuits, is $1 \times 10^{-4}$ Cm$^2$ then, for a chip having 100 pads, the area available for the formation of the decoupling capacitors on the surface of the active surface of the device is accordingly reduced. The total capacitance of the decoupling capacitors that can be provided on the active face of the device when using all the area available, i.e., the space on the active face not required for the chip pads etc. on the typical, above described chip, can readily be calculated to range between $5 \times 10^{-7}$ and $3.5 \times 10^{-11}$ Farads.

The present invention relies on using the entire back surface of the integrated circuit chip on which to form the decoupling capacitor and its total capacitance is determined as follows. Again if we assume that the typical chip is 0.8 cm long and has a width of 1.75 cm then the major surfaces thereof each has an area A of 1.4 cm$^2$. We will further assume the dielectric provided on the back major surface of the chip, is, as above discussed, silicon dioxide having a thickness s of $100 \times 10^{-8}$ cm$^2$ and a permitivity $\epsilon$. Now, however, because the present invention does not rely on having the capacitors on the active major surface of the circuit the number of pads and their sizes can be disregarded. Accordingly, because the entire back surface of the chip is available, the capacitor formed, using the entire back surface of the device as taught by the present invention, on the above described chip using the described dielectric materials can now be readily be calculated to range between $1 \times 10^{-6}$ and $1 \times 10^{-12}$ Farads. It should be understood that the capacitor or capacitors actually formed in the above example will depend on the selected plate area and that this can be less than the total area of the back side of the chip.

It should be further clearly understood that the range given in the above example was for a particularly sized chip and the graph shown will vary with chip size. Furthermore the graph can readily be altered by changing one or more elements in the above capacitor equation. That is, the capacitance can altered by selecting a different dielectric material, hence changing the permittivity, or by using a different size chip, or otherwise changing the area of the capacitor electrodes, or by changing the thickness of the formed dielectric layer or by altering any combination these elements. Thus, for example, the chip illustrated in FIG. 2 would provide four different capacitive values.

Figure 4:
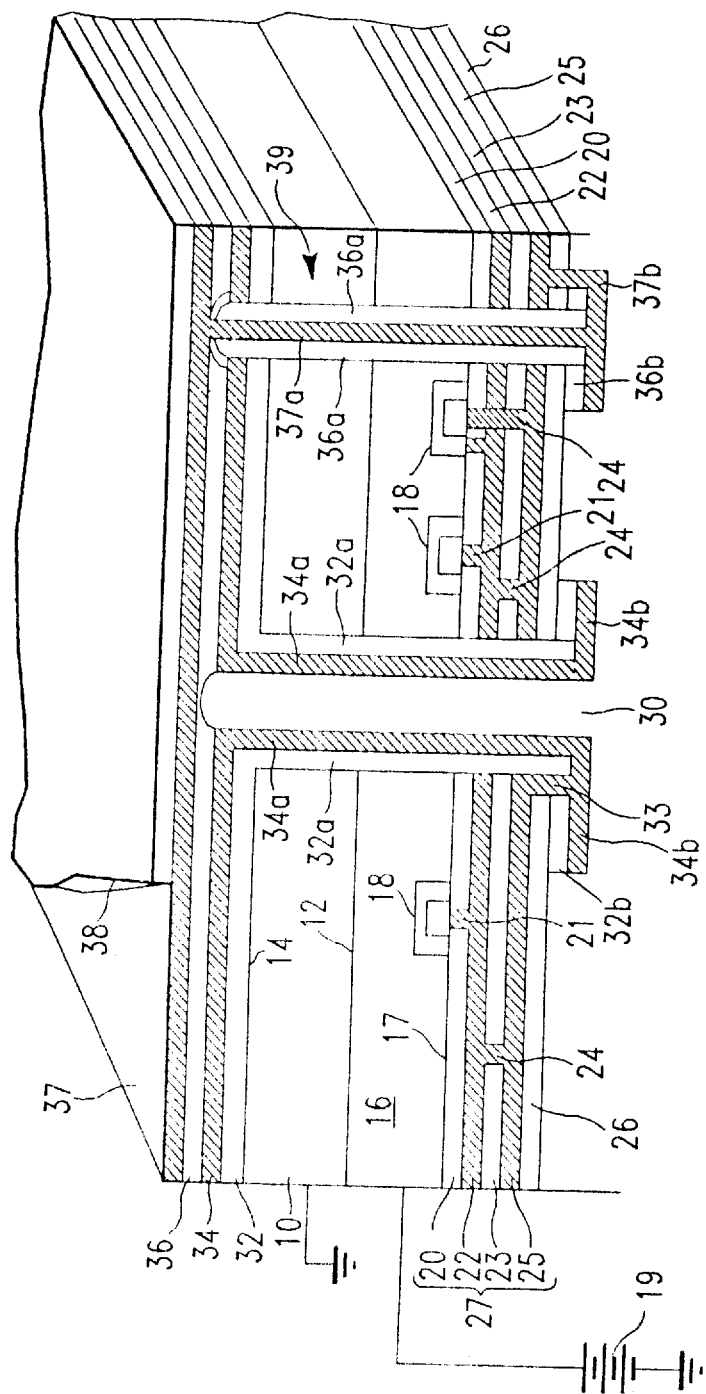
FIG. 4 is a cross-sectional schematic representation of a semiconductor chip similar to that of FIG. 1 but having a different embodiment of the decoupling capacitor formed on the back of the chip.

FIG. 4 is a cross-sectional schematic representation of a semiconductor chip similar to that of FIG. 1 but having a different embodiment of the decoupling capacitor formed on the back of the chip.

FIG. 4 shows a cross-sectional schematic representation of an semiconductor chip 10 showing a different embodiment of the present invention. The semiconductor chip or substrate 10 has a pair of substantially parallel major surfaces 12 and 14 with a doped or epitaxial layer or region 16 on surface 12 and a plurality of active and inactive devices 18 in the region 16. Again surface 12 is defined as the active face of the chip and surface 14 as the back of the chip and one or more wiring levels, interposed with insulating or passivating layers, are formed on the surface 17 of the region 16 to interconnect the formed devices 18 into a desired integrated circuit. Again the region 16 and the circuit formed of the devices 18 are coupled to a selected voltage source 19.

Again the via 30 passes through the substrate 10, the epitaxial layer 16, the insulating layers, 20, 23, and 26 and the wiring levels 22 and 25 to a selected position on the chip 10 and the backside surface 14 provided with a dielectric 32 overcoated with a conductive layer 34 both of which extend down the via 30 and as layers 32a and 34a and as layers 32b and 34b, wrap around over the wiring net 27 with layer 34b contacting the wiring net 27.

Now a new or additional via 39 is ablated, using the above described laser method, through the conductive layer 34, the dielectric layer 32 and through the substrate 10 the epitaxial layer 16, the insulating layers, 20, 23, and 26 and the wiring levels 22 and 25 to a different selected position on the chip 10. Once the new via 39 has been created, the layer 34 is insulatively coated with a suitable dielectric 36 and a second conductive layer 37 is formed over the layer 36 as described above. Again these added layers extend through the via 30 as layers 36a and 37a, and as layers 36b and 37b wrap around atop the wiring net 27. Again the layer 37a can be made to contact any suitable voltage or even ground in the wiring net 27.

Again the upper plate 37 may be coated with a suitable insulator 38 and the circuit completed by forming input/output pads (not shown) connected to the wiring net and then appropriately securing the finished unit to a suitable semiconductor package (not shown).

Figure 5:
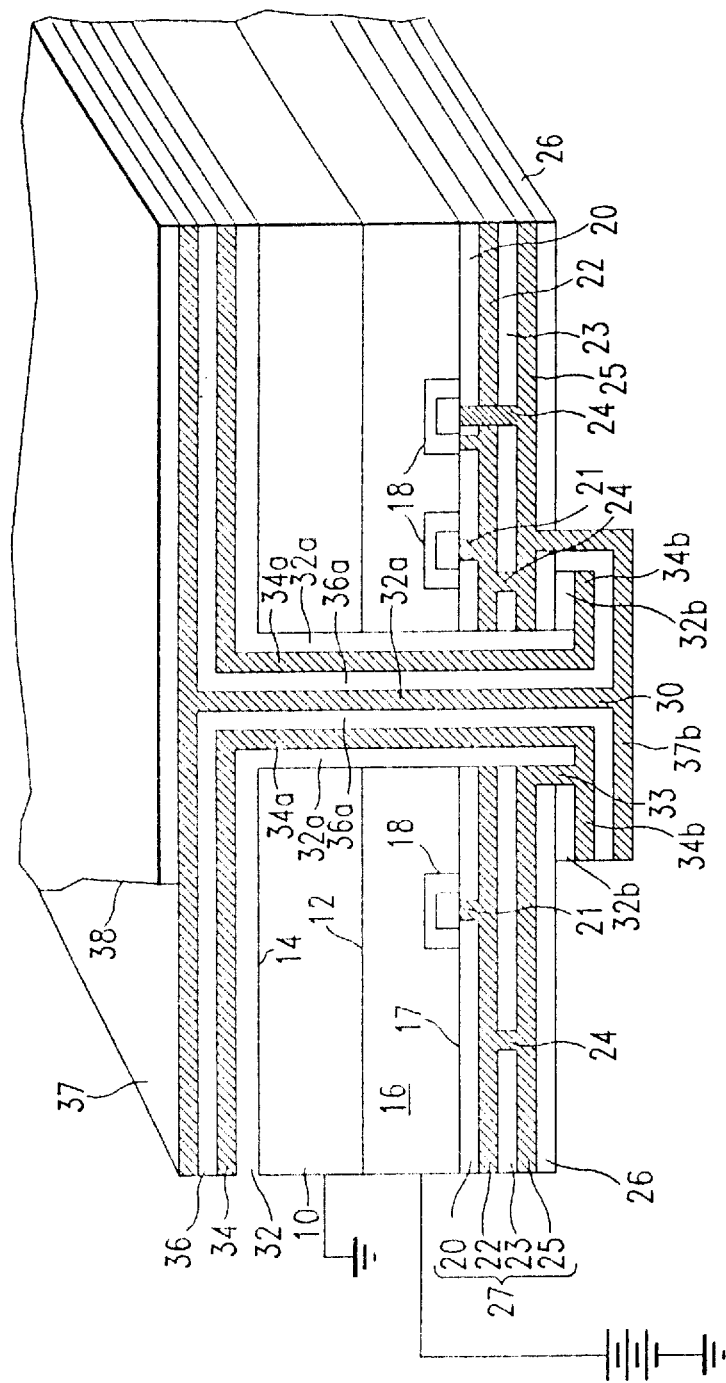
FIG. 5 is a cross-sectional schematic representation of a semiconductor chip similar to that of FIG. 4 but having still a further and different embodiment of the decoupling capacitor formed on the back of the chip.

FIG. 5 is a cross-sectional schematic representation of a semiconductor chip similar to that of FIG. 4 but having still a further and different embodiment of the decoupling capacitor formed on the back of the chip.

FIG. 5 shows a cross-sectional schematic representation of an semiconductor chip 10 and shows still a different embodiment of the present invention. The semiconductor chip or substrate 10 has a pair of substantially parallel major surfaces 12 and 14 with a doped or epitaxial layer or region 16 on surface 12 and a plurality of active and inactive devices 18 in the region 16. Again surface 12 is defined as the active face of the chip and surface 14 as the back of the chip and one or more wiring levels, interposed with insulating or passivating layers, are formed on the surface 17 of the region 16 to interconnect the formed devices 18 into a desired integrated circuit. Again the region 16 and the circuit formed of the devices 18 are coupled to a selected voltage source 19.

Again the via 30 passes through the substrate 10, the epitaxial layer 16, the insulating layers, 20, 23, and 26 and the wiring levels 22 and 25 to a selected position on the chip 10 and the backside surface 14 provided with a dielectric 32 overcoated with a conductive layer 34 both of which extend down the via 30 and as layers 32a and 34a and as layers 32b and 34b, wrap around over the wiring net 27 with layer 34b contacting the wiring net 27.

The layer 34 is now insulatively coated with a suitable dielectric 36 extended through the via 30, as taught above, as layer 36a to wrap around the layer 34b as layer 36b. A second conductive layer 37 is now formed over the layer 36 to also extend through the via 30 as layer 37a to wrap around atop the wiring net 27 as layer 37b. Again the layer 37a can be made to contact any suitable voltage or even ground in the wiring net 27.

Again the upper plate 37 may be coated with a suitable insulator 38 and the circuit completed by forming input/output pads (not shown) connected to the wiring net and then appropriately securing the finished unit to a suitable semiconductor package (not shown).

From the above it can be readily seen that the present invention provides significantly greater capacitance that was available to prior art devices which depended on placing the decoupling capacitors on the active surface of the circuit.

It should however be noted that in the present invention the available capacitance can be further extended by also combining the present invention with the prior art. That is, there is no reason as why a device built in accordance with the present invention cannot also incorporate the prior art decoupling capacitors on the face of the chip.

It should be noted that although the preferred embodiment has been described as using silicon substrates and associated materials that any semiconductor material and suitable materials can be substituted therefore as would be well known to those skilled in the semiconductor art.

It should be further noted that although the substrate has been described as being connected to ground that it could also be a connected to second voltage source such as a negative voltage source.

Thus the invention teaches a significant and very effective decoupling capacitor in close proximity to the active circuit on the chip requiring such decoupling capacitance.

While the invention has been particularly described with respect to a preferred embodiment, it should be understood that one skilled in the art can, from the foregoing, readily make changes in form and detail without departing from the spirit and scope of the invention.

What is claimed is:

1. A semiconductor circuit comprising:
   a semiconductor substrate having first and second major surfaces and first and second regions;
   a semiconductor junction between said first and second surfaces and separating said first and second regions;
   an integrated circuit, comprised of a plurality of active and passive devices, in said first region;
   a plurality of wiring levels, on said first surface overlying said integrated circuit, being coupled to respective ones of said active and passive devices;
   a voltage source coupled to one of said wiring levels;
   said second region being coupled to ground;
   an opening having extended walls passing through said first and second regions from said wiring levels to said second major surface;
   a first insulator disposed on said second major surface and on the walls of said opening; and
   a first metallic deposit on said first insulator on said second major surface and on the insulator on said walls and connected to said wiring level coupled to said voltage source whereby said metallic deposit forms one plate of a capacitor with respect to said substrate which is coupled to ground and forms the second plate of said capacitor.

2. The circuit of claim 1 wherein said substrate is formed of silicon and said first and second insulators are selected from the group consisting of polyamide, silicon nitride, and silicon dioxide.

3. The circuit of claim 1 wherein said first insulator is at least $50 \times 10^{-8}$ cm in thickness and said first metallic deposit is selected from the group consisting of tungsten, copper, gold, lead, aluminum, tin, copper aluminum, titanium, chrome and alloys thereof.

4. A semiconductor circuit comprising:
   a semiconductor substrate having first and second major surfaces and first and second regions separated from each other by a semiconductor junction;
   said first major surface abutting said first region and said second region abutting said second major surface;
   an integrated circuit, comprised of a plurality of active and passive devices, formed in said first region and extending to said first major surface;
   a plurality of wiring levels, on said first major surface and overlying said integrated circuit, being coupled to said active and passive devices and having a plurality of contact points;
   a voltage source coupled to one of said wiring levels;
   said second region being coupled to ground;
   a plurality of openings having extended walls passing through said first and second regions from said wiring levels to said second major surface;
   a first insulator disposed on said second major surface and on the walls of said openings; and
   a plurality of spaced metallic deposits formed on said insulator on said second major surface and on the insulator on said walls, each of said deposits extending down through a respective opening and being connected to a respective one of said contact points whereby each of said metallic deposits form one plate of a respective decoupling capacitor with respect to said substrate which is connected to ground and which forms the second plate of each respective decoupling capacitor.

5. The circuit of claim 4 wherein said substrate is formed of silicon.

6. The circuit of claim 4 wherein said substrate is formed of silicon, said first insulator is selected from the group consisting of polyamide, silicon nitride, and silicon dioxide.

7. The circuit of claim 4 wherein said first insulator is at least $50 \times 10^{-8}$ cm in thickness and said metallic deposit is selected from the group consisting of tungsten, copper, gold, lead, aluminum, tin, titanium, chrome and alloys thereof.

8. The circuit of claim 4 further wherein the conductive layer on said dielectric layer is further coated with a second insulating layer.

9. A process of forming a capacitor on a semiconductor substrate having first and second major surfaces comprising the steps of:

selecting a semiconductor substrate having first and second major surfaces;

forming a semiconductor junction in said substrate between said first and second major surfaces;

forming an integrated circuit, comprised of a plurality of active and passive devices, in said first region;

forming a plurality of wiring levels, overlying said integrated circuit and coupling said wiring levels to said active and passive devices;

coupling one of said wiring levels to a voltage source;

coupling said substrate to ground;

forming a hole through said first and second regions; said hole extending from said second major surface to said wiring level coupled to said voltage source and exposing a selected portion of said wiring level;

forming a dielectric layer on said second major surface of said substrate and a dielectric coating on the wall of said through hole, said dielectric coating in said hole extending to said wiring level;

forming a conductive layer on said dielectric layer on said second major surface of said substrate and on said dielectric on said wall of said hole; said conductive layer coating said dielectric on said wall of said hole, extending through said hole and electrically contacting said selected region of said first surface of said wiring level whereby said conductive layer forms one plate of a capacitor with respect to said second region which is connected to ground and forms the second plate of said capacitor.

10. The process of claim 9 wherein said formed hole is substantially cylindrical.

11. The process of claim 9 further comprising the steps of;

coating said conductive layer on said dielectric layer with an insulating layer.

12. A process of forming a capacitor on a semiconductor substrate having first and second major surfaces comprising the steps of:

selecting a semiconductor substrate having first and second major surfaces;

forming a semiconductor junction in said substrate between said first and second major surfaces to define first and second regions in said substrate;

forming an integrated circuit, comprised of a plurality of active and passive devices, in said first region;

forming a plurality of wiring levels, on said first surface and coupling said wiring levels to said active and passive devices in said integrated circuit;

coupling one of said wiring levels to a voltage source;

coupling said second region to ground;

forming a substantially cylindrical hole through said first and second regions extending from said second major surface to a selected wiring level on said integrated circuit;

forming a dielectric layer on said second major surface of said substrate and a dielectric lining on the wall of said through hole, said dielectric lining in said hole extending to said wiring level; and depositing a conductive layer on said dielectric layer on said second major surface of said substrate and on said dielectric lining in said hole; said conductive layer coating said dielectric on said lining in said hole being substantially coaxial with said wall of said hole and extending though said hole and electrically contacting said selected wiring level on said integrated circuit whereby said metallic deposit forms one plate of a capacitor with respect to said substrate which is connected to ground and forms the second plate of said capacitor.

13. A semiconductor circuit comprising:

a semiconductor substrate having first and second major surfaces;

a doped region on said first one of said major surfaces;

said doped region being separated from the remainder of said substrate by a semiconductor junction;

an integrated circuit, comprised of a plurality of active and passive devices, in said doped region;

a plurality of wiring levels, having selected contact points thereon, being coupled to respective ones of said active and passive devices;

one of said wiring levels being coupled to a voltage source;

said substrate being coupled to ground;

an opening having extended walls passing through said doped region and said substrate from said wiring levels to said second major surface;

a first insulator disposed on said second major surface and on the walls of said opening; and a first metallic deposit on said first insulator on said second major surface and on the insulator on said walls;

a second insulator disposed on said first metallic deposit and over the first metallic layer on the walls of said opening; and a second metallic deposit formed on said second insulator on said major surface and on said second insulator on said walls.

14. The circuit of claim 13 wherein a third insulator is disposed on said second metallic coating.

15. The circuit of claim 13 wherein said first and second metallic deposits are electrically connected to respective contact points on said wiring levels.

16. The circuit of claim 15 wherein said first metallic deposit is connected to a voltage and forms one plate of a capacitor and said second metallic deposit is connected to ground and forms the second plate of said capacitor.

17. The circuit of claim 13 wherein said substrate is formed of silicon, said said first and second insulators are selected from the group consisting of polyamide, silicon nitride, and silicon dioxide.

18. The circuit of claim 13 wherein said first and second insulators are at least $50 \times 10^{-8}$ cm in thickness and said first and second metallic deposits are selected from the group consisting of tungsten, copper, gold, lead, aluminum, tin, copper aluminum, titanium, chrome and alloys thereof.

19. A process of forming capacitors on a semiconductor substrate having first and second major surfaces comprising the steps of:

selecting a semiconductor substrate having first and second major surfaces;

forming a semiconductor junction in said substrate between said first and second major surfaces to define first and second regions in said substrate;

forming an integrated circuit, comprised of a plurality of active and passive devices, in said first region;

forming a plurality of wiring levels, overlying said integrated circuit and coupling said wiring levels to said active and passive devices;

coupling one of said wiring levels to a voltage source;

coupling said second region to ground;

forming a first substantially cylindrical hole through said substrate; said hole extending to a first selected region of said integrated circuit;

forming a first dielectric layer on said second major surface of said substrate and a dielectric lining on the wall of said through hole, said dielectric lining in said hole extending to said wiring level; and depositing a first conductive layer on said first dielectric layer on said second major surface of said substrate and on said first dielectric lining in said hole; said conductive layer coating said first dielectric on said lining in said hole being substantially coaxial with said wall of said hole and extending though said hole and electrically contacting said first selected region of said integrated circuit;

forming a second substantially cylindrical hole through said substrate; said hole extending to a second selected region of said integrated circuit;

forming a second dielectric layer on said first conductive layer on second major surface of said substrate and said second dielectric lining extending down the wall of said second through hole, said second dielectric lining in said second through hole extending to said said selected region of said integrated circuit; and depositing a second conductive layer on said second dielectric layer on said second major surface of said substrate and on said second dielectric lining in said second hole; said second conductive layer coating said second dielectric in said second hole being substantially coaxial with said wall of said second hole and extending though said second hole and electrically contacting said second selected region of said integrated circuit whereby said first and second conductive layers form a respective plate of a respective capacitor with respect to said substrate which is connected to ground and forms the second plate of each respective capacitor.

* * * * *